(12) United States Patent
Zhang et al.

(10) Patent No.: US 7,792,205 B2
(45) Date of Patent: Sep. 7, 2010

(54) ENCODING AND DECODING OF FRAME CONTROL HEADER IN DOWNLINK SUBFRAMES IN WIRELESS COMMUNICATION SYSTEMS

(75) Inventors: Wenfeng Zhang, San Diego, CA (US); Wenzhong Zhang, San Diego, CA (US); Jun Wu, San Diego, CA (US); Yonggang Fang, San Diego, CA (US)

(73) Assignee: ZTE (USA) Inc., Iselin, NJ (US)

( * ) Notice: Subject to any disclaimer, the term of this patent is extended or adjusted under 35 U.S.C. 154(b) by 1366 days.

(21) Appl. No.: 11/249,010

(22) Filed: Oct. 11, 2005

(65) Prior Publication Data
US 2006/0083336 A1    Apr. 20, 2006

Related U.S. Application Data

(60) Provisional application No. 60/618,427, filed on Oct. 12, 2004.

(51) Int. Cl.
*H04L 5/12* (2006.01)

(52) U.S. Cl. .................. 375/262; 375/240; 375/341; 714/786; 714/795

(58) Field of Classification Search .............. 375/240, 375/262, 265, 341, 346; 714/786, 792, 794, 714/795
See application file for complete search history.

(56) References Cited

U.S. PATENT DOCUMENTS

| 6,625,762 | B1 * | 9/2003 | Le Dantec ................. 714/701 |
| 2003/0026346 | A1 * | 2/2003 | Matsumoto et al. ......... 375/262 |
| 2007/0116052 | A1 * | 5/2007 | Yu et al. .................... 370/473 |

* cited by examiner

*Primary Examiner*—Dac V Ha
(74) *Attorney, Agent, or Firm*—Perkins Coie LLP

(57) ABSTRACT

Techniques and devices for encoding and decoding a signal channel in a downlink signal in wireless communication systems, including the frame control header (FCH) data in IEEE 802.16 systems with reduced transmission power consumption, improved error correction capability, and reduced decoding complexity.

17 Claims, 4 Drawing Sheets

ENCODING AND DECODING OF FRAME CONTROL HEADER IN DOWNLINK SUBFRAMES IN WIRELESS COMMUNICATION SYSTEMS

CROSS REFERENCE TO RELATED APPLICATIONS

This application claims the benefit of provisional U.S. application Ser. No. 60/618,427, entitled "Maximum Likelihood Decoding on 802.16e-OFDMA FCH" and filed Oct. 12, 2004, which is incorporated herein by reference in its entirety as part of the specification of this application.

BACKGROUND

This application is related to the transmission and reception of a channel in a downlink signal in wireless communication systems including the Frame Control Header (FCH) defined in the wireless LAN/MAN standards specified under the IEEE 802.16 for wireless communications using orthogonal frequency division multiplexing (OFDM) and orthogonal frequency division multiple access (OFDMA).

OFDM and OFDMA wireless communication systems under IEEE 802.16 use a network of base stations to communicate with wireless devices or mobile stations registered for services in the systems based on the orthogonality of frequencies of multiple subcarriers (currently 1028 subcarriers) and can be implemented to achieve a number of technical advantages for wideband wireless communications, such as resistance to multipath fading and interference. Each base station emits radio signal that carry data such as voice data and other data content to wireless devices. Such a signal from a base station includes an overhead load, in addition to the data load (voice and other data), for various communication management functions. Each wireless device processes the information in the overhead load of each received signal prior to processing the data.

Under the current versions of the IEEE 802.16 standard for the OFDMA systems, every downlink subframe from a base station includes a preamble and a FCH following the preamble as part of the overhead load. The preamble includes information for searching a cell and a cell sector within a cell and for synchronizing a mobile station in both time and frequency with the observed downlink signal. The FCH part of the downlink subframe includes 24 bits with information on the downlink transmission format (i.e., the DL-MAP) and control information for the downlink data reception (i.e., allocation of the 1028 subcarriers in the current downlink frame). Due to the nature of the information in the FCH, if the reception of FCH fails, the following downlink operations on the receiver side cannot be properly executed. Accordingly, the robustness of proper reception of the FCH is important to the overall system throughput.

FIGS. 1A and 1B illustrate the FCH channel encoding in a base station and the FCH channel decoding in a mobile station, respectively, under versions of IEEE 802.16 as of today. In the FCH encoding shown in FIG. 1A, the 24 bits of information in the FCH are repeated once by a sequence repeater 102 to produce a sequence of 48 bits, i.e., concatenating the 24-bit sequence and its identical duplicate sequence in time. The 48-bit output sequence is then randomized with a randomizing sequence by a modulo-2 adder 104. The addition of the 48-bit sequence and the randomizing sequence on a bit-by-bit basis produces a 48-bit randomized sequence. Next, a rate ½ (R=½) tail-biting convolutional coding is performed on each bit by encoder 106 to produce two encoded bits so that the 48-bit randomized sequence is encoded as a 96-bit output FCH sequence for transmission by the base station. This convolutional coding adds redundancy to the output sequence against bit errors that may occur during the signal transmission and forms the forward error correction (FEC) mechanism for controlling the bit errors in broadcasting downlink signals.

FIG. 1B shows the Viterbi decoding operation at a receiving mobile station under the versions of IEEE 802.16.

First, the received 96 symbols in the FCH sequence are converted into 96 "soft" symbols by applying a soft metrics to the received encoded bits. Each received encoded bit is not represented by a "hard" one or zero but by a multi-level "soft" value that represents the maximum likelihood that the encoded bit is to be either one or zero. The Viterbi decoding algorithm is known to have better performance with soft input symbols. A Viterbi tail-biting decoder 122 is then used to decode the 96 soft symbols into 48 "hard" bits of zeros and ones. Hence, in this context, the Viterbi decoder 122 is a soft-input-hard-output device or operator. The output bit sequence from the Viterbi decoder 122 is further de-randomized with the same randomizing sequence as used at the transmitter side by a modulo-2 adder 124. Referring to FIG. 1A, this decoding process in FIG. 1B is a reverse process of the encoding. Hence, after the de-randomization, the resulting sequence has 48 bits of "0" or "1" bits and, if no decoding error occurs, should be two identical 24-bit parts like the 48-bit sequence prior to the randomization step in the encoding process. A bit selector 126 then determines the final 24-bit FCH reception by choosing either 24-bit part in the 48-bit sequence.

SUMMARY

The above decoding procedure in FIG. 1B has a drawback that only one of the two duplicated 24-bit parts prior to randomization in the decoding process in FIG. 1B is used to contribute to improving the reception performance. The other 24-bit part that is not used is wasted. As a result, the decoding process in FIG. 1B does not fully utilize the available 48-bit sequence to improve the error resistance capability of the encoding process in FIG. 1A. In addition, the unused 24-bit part accounts for one half of the total power used in the decoding process and thus the decoding process in FIG. 1B is not energy efficient.

This application provides implementations of decoding and encoding mechanisms that use both duplicated 24-bit parts to improve the bit error resistance of the FCH channel and to reduce the base station transmit power requirement for a given target performance in the FCH decoding within the mobile station. In one specific example, the decoding described in this application first performs the de-randomization on the received 96 soft symbols and combines the duplicated bits in the de-randomized 96 soft symbols to produce a 48-bit sequence of soft symbols with a higher signal-to-noise ratio and accordingly improved bit error correction on the soft decision based on the maximum likelihood. The Viterbi decoding is then performed on the soft 48-bit sequence to produce the decoded 24-bit FCH sequence. Different from the decoding process in FIG. 1B, the present process is not a literal reverse process of the decoding process in FIG. 1A but is designed to achieve the equivalent decoding function of the decoding process in FIG. 1B with improved bit error resistance and energy efficiency.

In one implementation, a method is described for handling encoded frame control header (FCH) data of a frame control header in a downlink signal in a wireless communication system. A randomizing sequence, which is used to randomize the encoded FCH data in generating the downlink signal, is first encoded with the same convolutional encoder and the output sequence is used to de-randomize the received FCH data to form a de-randomized sequence of soft bit symbols indicating a likelihood of each bit at one of two binary states. The de-randomized sequence has different repetitive segments each corresponding to a common sequence. The soft bit symbols of the different repetitive segments are combined, bit by bit, to form a combined sequence where each bit is a soft bit symbol which is a sum of soft bit symbols of corresponding bit positions from the different repetitive segments. The combined sequence has a number of bits that is a number of bits in the de-randomized sequence divided by a number of the different repetitive segments in the de-randomized sequence. Viterbi decoding is applied on the combined sequence to produce a decoded FCH sequence having binary bit symbols.

The encoding in the above method may be implemented as follows. A convolutional coding is applied to an FCH sequence of binary bits to produce an encoded FCH sequence. At least one duplicate of the encoded FCH sequence is added at an end of the encoded FCH sequence in time to produce a new encoded FCH sequence. The convolutional coding is applied on the randomizing sequence of binary bits to produce an encoded randomizing sequence of binary bits. The encoded randomizing sequence is added to the new coded FCH sequence, bit by bit, to produce the encoded and randomized FCH data in the downlink signal.

This application also describes a device for decoding repeated, randomized and encoded frame control header (FCH) data. This device includes a module to receive the repeated, randomized, and encoded FCH data and to apply a randomizing sequence, which is generated by convolutional encoding an initial randomizing sequence that is used to randomize the encoded FCH data, to de-randomize the repeated, randomized, and encoded FCH data to form a de-randomized sequence of soft bit symbols indicating a likelihood of each bit at one of two binary state. The de-randomized sequence includes a plurality of repetitive segments each corresponding to a common sequence. A combiner is included in this device to combine soft bit symbols of the different repetitive segments, bit by bit, to form a combined sequence where each bit is a soft bit symbol which is a sum of soft bit symbols of corresponding bit positions from the repetitive segments. The number of bits in the combined sequence is equal to the number of bits in the de-randomized sequence divided by the number of the repetitive segments in the de-randomized sequence. A Viterbi decoder also included in this device to perform Viterbi decoding on the combined sequence to produce a decoded FCH sequence having binary bit symbols. The above device further includes a mechanism to compute, prior to the Viterbi decoding, a likelihood of each soft bit symbol in the combined sequence at one of two binary states. The sequence output from this mechanism is then processed by the Viterbi decoding.

These and other implementations and examples of the encoding and decoding techniques in software and hardware for handling FCH data and other signals are described in greater detail in the attached drawings, the detailed description, and the claims.

DETAILED DESCRIPTION

Figure 1A:
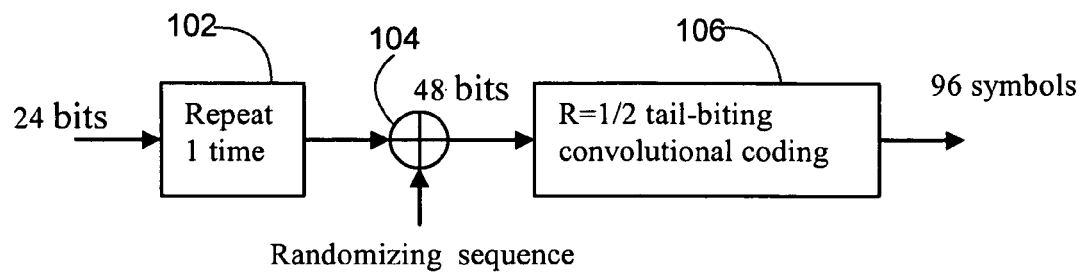
FIG. 1A shows one example of a FCH encoding process used in IEEE 802.16 which includes repetition, randomization, and convolutional coding of the FCH transmitting chain.

Referring to FIG. 1A, the 96-bit encoded sequence from the encoding process under versions of IEEE 802.15 is produced from a 48-bit sequence that concatenates two identical copies of the same 24-bit FCH sequence in time. The decoding described in this application explores this duplication as a useful feature to reduce the bit error in the soft decision based on the maximum likelihood and to reduce the number of encoded bits to be processed by the Viterbi decoding process. In the specific examples described here, the receiving process first performs the de-randomization process and then combines the de-randomized 96 soft input symbols into 48 soft symbols. The present decoding technique reduces the required transmission power by 3 dB for a given frame error rate and meanwhile reduces the decoding complexity by one half because decoding block size is reduced by one half (e.g., from 96 to 48 in the sequence size to be decoded).

Figure 2:
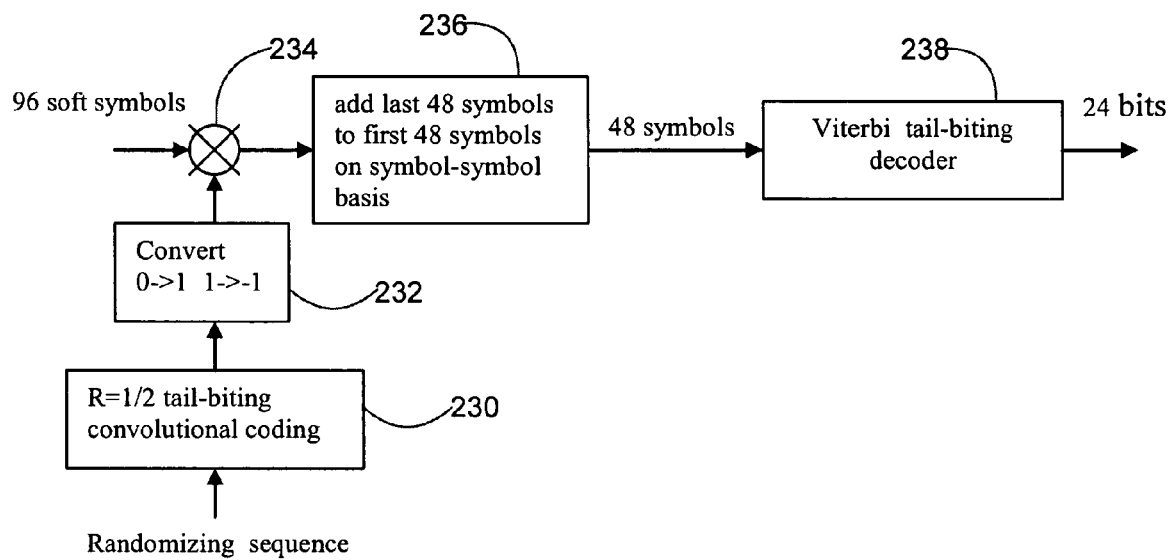
FIG. 2 illustrates an exemplary implementation of the present FCH decoding technique.

FIG. 2 illustrates an example of the decoding process according to one implementation. The process in FIG. 2 may be implemented as a software process or a digital circuit. In the software implementation, each functional block depicted in FIG. 2 represents either a processing step in a programmed digital signal processor or a microprocessor. In the hardware implementation, each functional block depicted in FIG. 2 represents a circuit element and the digital circuit for performing the process may be configured to include one or more application-specific integrated circuits (ASICs) in the mobile station.

First, the same 48-bit randomizing sequence of binary bits used in the encoding process in FIG. 1A is encoded with a R=½ tail-biting convolution encoder 230 to produce an convolutional encoded 96-bit randomizing sequence of binary bits. This 48-bit randomizing sequence may be a pseudorandom sequence of binary bits. A signal converter 232 next converts the 96-bit randomizing sequence with binary bits into a bipolar randomizing sequence where each bit is either "+1" or "−1." In this conversion, each "0" bit in the 96-bit randomizing sequence is converted to a "+1" symbol and each "1" bit to a "−1" symbol to generate an encoded and converted randomizing sequence of 96 bipolar bits. The encoded and converted randomizing sequence is then multiplied with the received soft encoded 96 input FCH symbols at a multiplier 234. This de-randomizes the received 96 soft symbols where the first 48 symbols correspond to the first 24-bit sequence in the decoding process and the second 48 symbols correspond to the second 24-bit sequence in the decoding process. Next at a symbol combiner 236, the first 48 symbols and the last 48 symbols of the resultant 96 symbols from the multiplier 234 are combined, symbol by symbol or bit by bit. For example, the first symbol and the 49-th symbol are summed up to be the first symbol of the output sequence, the second symbol and the 50-th symbol are summed up to be the second symbol of the output sequence, and etc. Next, the combined 48 soft symbols are fed into the Viterbi decoder 238 to obtain the final 24 hard bits as the decoded FCH bits. Prior to the Viterbi decoding, the combined 48 soft symbols are first computed to determine the likelihood matrix of each symbol or bit at one of two binary states. As an example, for bipolar bits with two possible states for each bit, e.g., based on binary phase shift keying (PBSK), the likelihood matrix for each symbol is a 2×1 matrix with two matrix elements. Under quadrature phase shift keying (QPSK), each bit has four different possible states and the corresponding likelihood matrix is a 2×2 matrix with four matrix elements. The Viterbi decoding is then applied to the hard binary symbols with the associated likelihood matrix to produce the final 24 decoded FCH hard bits. The Viterbi decoder 238 may include a front-end process to perform this computation of the likelihood. Alternatively, a converter for performing this computation may be implemented between the combiner 236 and the Viterbi decoder 238.

Figure 1B:
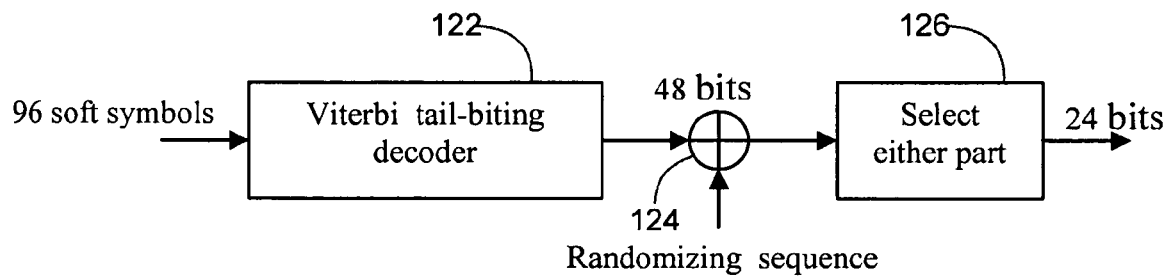
FIG. 1B shows an example of a FCH decoding process used in IEEE 802.16 which includes Viterbi decoding, de-randomization, and bit-selection of the FCH receiving chain.

Notably, the addition operation at the combiner 236 adds the likelihood matrices of the same bit in the two duplicated sequences together to reduce the bit error probability for that bit. Hence, the bit information carried by duplicated bits originated from the two copies of the same 24-bit in the encoding process in FIG. 1A is used to reduce the bit error in the decoding process. In the decoding process in FIG. 1A, only the bit information from one of the two copies of the same 24-bit sequence in the decoding process is used to reduce the bit error in the decoding process. In this regard, the decoding process in FIG. 2 is superior. Also, the Viterbi decoder 238 now processes only 48 bits instead of 96 bits by the Viterbi decoder 122 in FIG. 1B.

The decoding process in FIG. 2 may be used to decode the FCH channel in downlink signals encoded by the encoding process or circuit in FIG. 1A. In addition, the decoding process in FIG. 2 may be used to decode the FCH channel in downlink signals encoded by other encoding processes or circuits.

Figure 3:
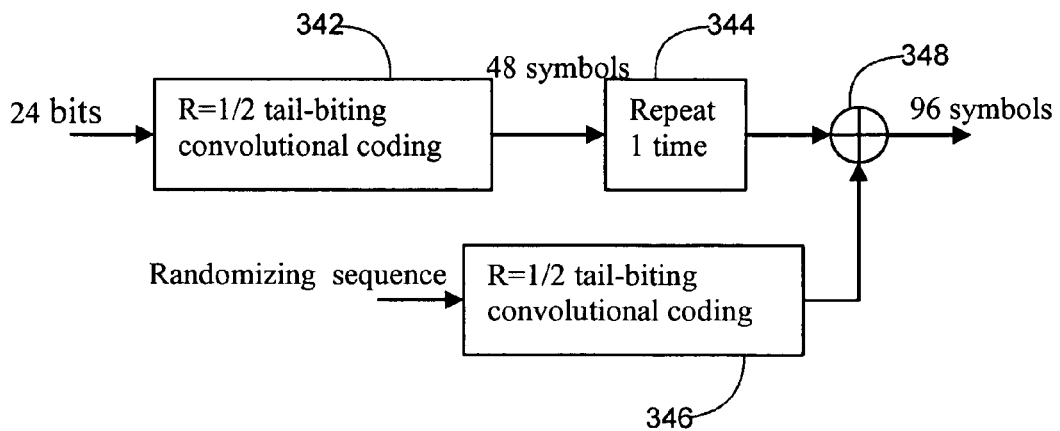
FIG. 3 illustrates an exemplary FCH encoding process as an alternative to the FCH encoding process in FIG. 1A.

FIG. 3 shows an alternative encoding process which is the reverse procedure of the decoding process shown in FIG. 2. This encoding process implements different encoding operations from the encoding process in FIG. 1A but is identical in its input and output and functionality to the FCH encoding process shown in FIG. 1A. As with the encoding process in FIG. 1A, the 24 information bits from the FCH are fed into the convolutional encoder 342. The output sequence is then repeated once by the sequence repeater 344. A randomizing sequence is fed into a convolutional encoder 346 that has the same structure and initial state as the convolutional encoder 342. A repeater 344 repeats the received 48-bit sequence in time to produce a 96-bit sequence which concatenates two identical copies of the same 48-bit FCH sequence in time. Next, the encoded and repeated FCH sequence is randomized with the encoded randomizing sequence by a mod-2 adder 348 to produce a 96-bit output sequence as part of the downlink subframe.

The encoding process in FIG. 3 can be shown to be functionally equivalent to the encoding process in FIG. 1A. This equivalence further shows that the FCH decoding in FIG. 2 is correct. The proof of the equivalence can be approached in two steps shown in FIGS. 4A and 4B.

Figure 4A:
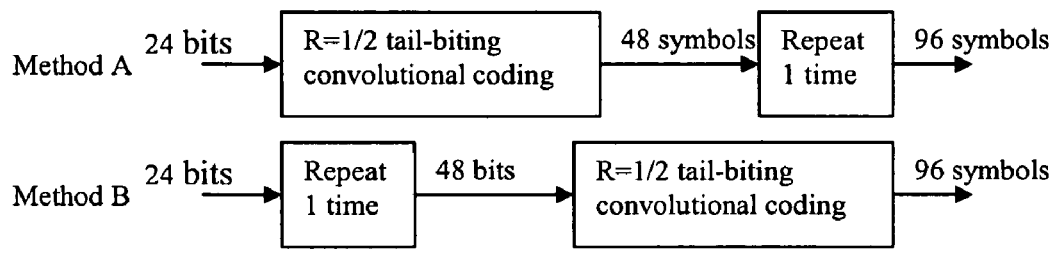
FIG. 4A illustrates the equivalency between two methods of convolutional encoding and sequence repetition.

FIG. 4A shows that, in the upper part of FIG. 3, the position of R=½ tail-biting convolution encoding and the repeat operation can be exchanged without altering the output. This is equivalent to showing that the two processing methods A and B in FIG. 4A issue the same output sequences if the input sequences fed into two chains are the same. In both methods A and B, the first 48 symbols in the two output sequences are the same because they come from the same encoder with same 24-bit input sequences. In the method A, the last 48 output symbols are simply the repetition of the first 48 symbols. In the method B, for the second 24-bit segment after the repetition, the encoder proceeds with the same initial/ending register states as used by the first 24-bit segment and the same 24-bit input stream, therefore the last 48 output symbols in method B are also the repetition of the first 48 output symbols. Based on the above, the methods A and B in FIG. 4A are equivalent in function and have the same input and output.

Figure 4B:
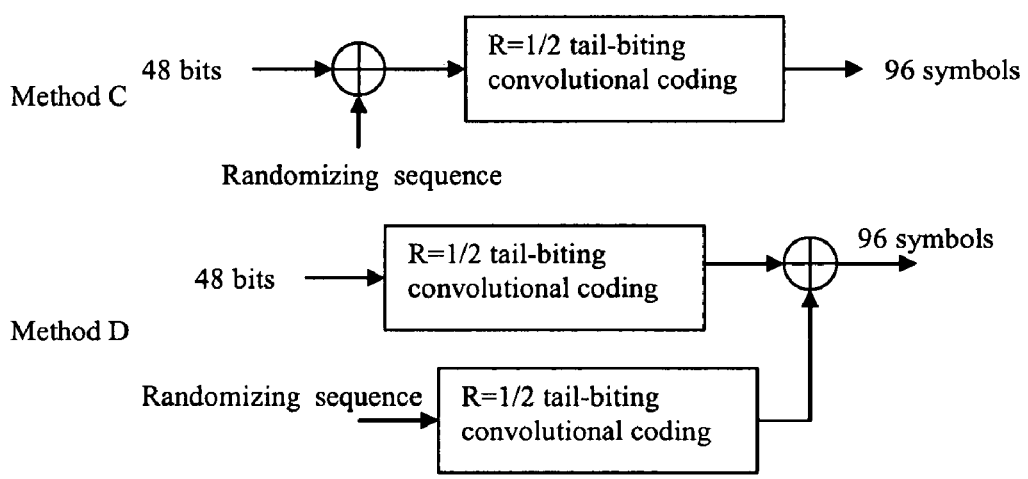
FIG. 4B illustrates the equivalency between two methods of convolutional encoding and sequence randomization.

FIG. 4B shows two different methods C and D to process the same 48-bit input sequence and the same 48-bit randomizing sequence to produce two 96-bit output sequences. Assume the convolution encoding operator is a linear operator and represented by F. The 48-bit input sequence and the randomization sequence can be represented as d and r respectively. Because F is a linear operator, $F(d+r)=F(d)+F(r)$. Therefore, the two 96-bit output sequences are identical.

Figure 5:
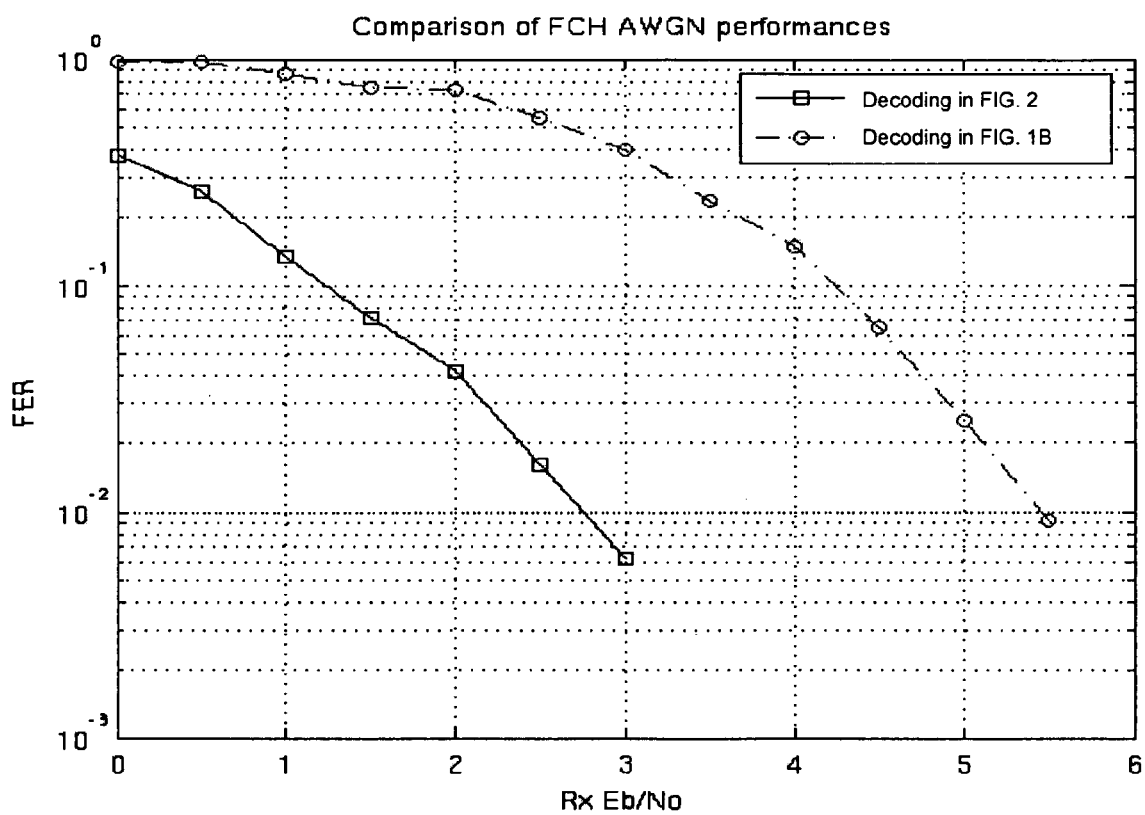
FIG. 5 shows 3 dB performance gain in computer simulation result with the FCH decoding shown in FIG. 2 (i.e. it requires 3 dB less energy per bit in the received FCH signal than the FCH decoding method shown in FIG. 1B).

The above equivalence in both FIGS. 4A and 4B demonstrates that the encoding process in FIG. 3 is equivalent to the encoding process in FIG. 1A for the same 24-bit input sequence and the same randomizing sequence. FIG. 5 shows the computer simulation results that compare the performance of decoding processes in FIGS. 1B and 2 where a 3-dB performance gain is obtained in the decoding method in FIG. 2.

Only one FCH decoding process is described here with reference to FIG. 2 as an example. The forward error correction encoder is not limited to R=½ tail-biting convolution encoder. The FCH decoding method illustrated in FIG. 2 and the FCH encoding method illustrated in FIG. 3 may be used for any coding rate, for any encoder size, and for the zero-tail linear encoding or any general tail-biting linear encoding scheme where the ending state equals to the initial state. In the illustrated example, the repetition of the same sequence is made only once in the encoding process. The encoding and decoding techniques described here may be used for any integer multiples of repetition. The encoding and decoding techniques may also be used on a signal channel (data channel or control channel) in communication systems based on a time division multiple access (TDMA), code division multiple access (CDMA), or orthogonal frequency division multiple access (OFDMA).

In implementations, the above described techniques and their variations may be implemented as computer software instructions or firmware instructions. Such instructions may be stored in an article with one or more machine-readable storage media or stored in one or more machine-readable storage devices connected to one or more computers or digital processors such as digital signal processors and microprocessors. On the base station side, the encoding process may be implemented in form of software instructions or firmware instructions for execution by a processor in the base station or its base station controller. On the wireless device or mobile station side, the decoding process may be implemented in form of software instructions or firmware instructions for execution by a processor in the wireless device or mobile station. In operation, the instructions are executed by one or more processors to cause the machine to perform the described functions and operations.

Other variations and enhancements are possible based on what is described here.

What is claimed is:

1. A method for handling repeated, randomized and encoded frame control header (FCH) data of a downlink signal in a wireless communication system, comprising:
   applying a convolutional coding to a randomizing sequence, which is used to randomize the encoded FCH data in generating the downlink signal, to produce an encoded randomizing sequence longer than the randomizing sequence;
   using the convolutional encoded sequence to de-randomize the encoded FCH data to form a de-randomized sequence of soft bit symbols indicating a likelihood of each bit at one of two binary states, wherein the de-randomized sequence includes a plurality of repetitive segments each corresponding to a common sequence;
   combining soft bit symbols of the different repetitive segments, bit by bit, to form a combined sequence where each bit is a soft bit symbol which is a sum of soft bit symbols of corresponding bit positions from the repetitive segments, wherein a number of bits of the combined sequence is equal to a number of bits in the de-randomized sequence divided by a number of the repetitive segments in the de-randomized sequence, and wherein each soft bit symbol in the combined sequence indicates a likelihood of each bit at one of two binary states; and
   using a decoder to perform Viterbi decoding on the combined sequence to produce a decoded FCH sequence having binary bit symbols.

2. A method as in claim 1, further comprising: prior to the Viterbi decoding, computing the likelihood matrix of each soft bit symbol of the combined sequence at one of two binary states to produce a binary bit symbol for each bit in the combined sequence.

3. A method as in claim 1, wherein the de-randomizing of the encoded data using the randomizing sequence comprises:
   applying a convolutional coding on the randomizing sequence of binary bits to produce an encoded randomizing sequence of binary bits, wherein the convolutional coding is used to generate the encoded FCH data;
   converting the encoded randomizing sequence of binary bits into a randomizing sequence of bipolar bits; and
   multiplying the encoded and converted randomizing sequence of bipolar bits with the encoded FCH data, bit by bit, to produce the de-randomized sequence of soft bit symbols.

4. A method as in claim 1, further comprising:
   applying a convolutional coding to a FCH sequence of binary bits to produce an encoded FCH sequence;
   adding at least one duplicate of the encoded FCH sequence at an end of the encoded FCH sequence in time to produce a new encoded FCH sequence;
   applying the convolutional coding on the randomizing sequence of binary bits to produce an encoded randomizing sequence of binary bits; and
   adding the encoded randomizing sequence to the new encoded FCH sequence with a mod-2 adder, bit by bit, to produce the encoded and randomized FCH data in the downlink signal.

5. A device for decoding repeated, randomized and encoded frame control header (FCH) data, comprising:
   a module to receive the repeated, randomized, and encoded FCH data and to apply a randomizing sequence, which is generated by convolutional encoding an initial randomizing sequence that is used to randomize the encoded FCH data, to de-randomize the repeated, randomized, and encoded FCH data to form a de-randomized sequence of soft bit symbols indicating a likelihood of each bit at one of two binary state, wherein the de-randomized sequence includes a plurality of repetitive segments each corresponding to a common sequence;
   a combiner to combine soft bit symbols of the different repetitive segments, bit by bit, to form a combined sequence where each bit is a soft bit symbol which is a sum of soft bit symbols of corresponding bit positions from the repetitive segments, wherein a number of bits in the combined sequence is equal to a number of bits in the de-randomized sequence divided by a number of the repetitive segments in the de-randomized sequence; and
   a Viterbi decoder to perform Viterbi decoding on the combined sequence to produce a decoded FCH sequence having binary bit symbols.

6. A device as in claim 5, further comprising a mechanism to compute, prior to the Viterbi decoding, a likelihood matrix of each soft bit symbol in the combined sequence at one of two binary states.

7. A device as in claim 5, wherein the module comprises:
   a convolutional encoder to apply the convolutional coding on the randomizing sequence of binary bits to produce an encoded randomizing sequence of binary bits;
   a bit converter to convert the encoded randomizing sequence of binary bits into a randomizing sequence of bipolar bits; and
   a multiplier to receive the encoded and converted randomizing sequence of bipolar bits and the encoded FCH data and to multiply the encoded and converted randomizing sequence of bipolar bits with the encoded FCH data, bit by bit, to produce the de-randomized sequence of soft bit symbols.

8. A method for handling frame control header (FCH) data under IEEE 802.16, comprising:
   converting a randomizing sequence used in encoding an encoded FCH data sequence into a converted randomizing sequence;
   multiplying the converted randomizing sequence with the encoded FCH data sequence of soft symbols, bit by bit, to produce a de-randomized encoded FCH data sequence with new soft symbols;
   adding symbols in a first one half of the new soft symbols of the de-randomized encoded FCH data sequence to symbols in a second one half of the new soft symbols of the de-randomized encoded FCH data sequence, respectively, according to an ascending order to produce a set of sum symbols wherein the first symbol in the first one half and the first symbol in the second one half are added to produce a first sum symbol, the second symbol in the first one half and the second symbol in the second one half are added to produce a second sum symbol, . . . , and the last symbol in the first one half and the last symbol in the second one half are added to produce a last sum symbol; and
   using a decoder to apply Viterbi tail-biting decoding to the set of sum symbols to produce decoded FCH data.

9. The method as in claim 8, wherein the received soft symbols have 96 symbols and the decoded data has 24 bits.

10. The method as in claim 8, further comprising using a ½ tail-biting convolution encoder to produce the received soft symbols.

11. The method as in claim 8, further comprising using an encoder that is not a ½ tail-biting convolution encoder to produce the received soft symbols.

12. The method as in claim 8, further comprising using a zero-tail encoder to produce the received soft symbols.

13. The method as in claim 8, further comprising using a tail-biting encoder to produce the received soft symbols.

14. The method as in claim 8, wherein the random sequence converted by the converting step is an encoded random sequence which is generated by applying a convolutional coding to an initial randomizing sequence which is used to cause randomization in the data of the downlink signal and is longer than the initial randomizing sequence.

15. The method as in claim 8, wherein the converted randomizing sequence is a sequence of bipolar bits.

16. A device for encoding frame control header (FCH) data, comprising:
- a convolutional encoder to apply a convolutional coding to a FCH sequence of binary bits to produce an encoded FCH sequence;
- a module to add at least one duplicate of the encoded FCH sequence at an end of the encoded FCH sequence in time to produce a new encoded FCH sequence;
- a second convolutional encoder to apply the convolutional coding on a randomizing sequence of binary bits to produce a coded randomizing sequence of binary bits; and
- an adder with mod-2 to add the encoded randomizing sequence to the new encoded FCH sequence, bit by bit, to produce encoded FCH data in a downlink signal.

17. An article comprising one or more machine-readable storage media that store machine-executable instructions operable to cause a machine to handle repeated, randomized and encoded data of a downlink signal in a wireless communication system, comprising:
- apply a convolutional coding to a randomizing sequence, which is used to cause randomization in the data of the downlink signal, to produce an encoded randomizing sequence longer than the randomizing sequence;
- use the convolutional encoded sequence to de-randomize the data of the downlink signal to form a de-randomized sequence of soft bit symbols indicating a likelihood of each bit at one of two binary states, wherein the de-randomized sequence includes a plurality of repetitive segments each corresponding to a common sequence;
- combine soft bit symbols of the different repetitive segments, bit by bit, to form a combined sequence where each bit is a soft bit symbol which is a sum of soft bit symbols of corresponding bit positions from the repetitive segments, wherein a number of bits of the combined sequence is equal to a number of bits in the de-randomized sequence divided by a number of the repetitive segments in the de-randomized sequence, and wherein each soft bit symbol in the combined sequence indicates a likelihood of each bit at one of two binary states;
- compute a likelihood matrix of each soft bit symbol of the combined sequence at one of two binary states to produce a binary bit symbol for each bit in the combined sequence; and
- perform Viterbi decoding on the combined sequence with binary bit symbols to produce a decoded sequence having binary bit symbols.

* * * * *